US009685931B2

(12) United States Patent
Taghivand et al.

(10) Patent No.: US 9,685,931 B2
(45) Date of Patent: Jun. 20, 2017

(54) HIGH ACCURACY MILLIMETER WAVE/RADIO FREQUENCY WIDEBAND IN-PHASE AND QUADRATURE GENERATION

(71) Applicant: QUALCOMM Incorporated, San Diego, CA (US)

(72) Inventors: Mazhareddin Taghivand, Campbell, CA (US); Tong Zhang, Seattle, WA (US); Mohammad Mahdi Ghahramani, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/471,608

(22) Filed: Aug. 28, 2014

(65) Prior Publication Data

US 2016/0065179 A1 Mar. 3, 2016

(51) Int. Cl.
*H03K 5/00* (2006.01)
*H03H 11/12* (2006.01)
(Continued)

(52) U.S. Cl.
CPC ...... *H03H 11/1204* (2013.01); *H03H 7/0153* (2013.01); *H03H 7/21* (2013.01);
(Continued)

(58) Field of Classification Search
CPC .... G06G 7/02; H03H 11/1204; H03H 7/0153; H03H 7/21; H03H 11/22; H03H 17/0273; H03H 221/04
(Continued)

(56) References Cited

U.S. PATENT DOCUMENTS 6,236,847 B1 * 5/2001 Stikvoort ............... H03D 7/166
455/190.1
6,564,045 B1 5/2003 Fransis
(Continued)

FOREIGN PATENT DOCUMENTS

JP 2009177463 A 8/2009

OTHER PUBLICATIONS

Haddad F., et al., "Polyphase Filter Design Methodology for Wireless Communication Applications," Mobile and Wireless Communications: Network layer and circuit level design, 2010, pp. 219-246.
(Continued)

*Primary Examiner* — Dinh T Le
(74) *Attorney, Agent, or Firm* — Patterson & Sheridan, L.L.P (57) ABSTRACT

Certain aspects of the present disclosure provide circuits for generating high accuracy millimeter wave or radio frequency (RF) wideband in-phase (I) and quadrature (Q) oscillating signals having acceptable amplitude and phase mismatch over process, voltage, and temperature (PVT) variations with reduced cost, area, and power consumption. In one example apparatus, a polyphase filter having a first stage and a second stage is provided. Each stage comprises resistive elements and capacitive elements. Certain aspects of the present disclosure provide for intentional resistive and/or capacitive value mismatch between the resistive or capacitive values of one or multiple stages such that the phase mismatch between the resulting I and Q signals may be reduced without degrading the amplitude mismatch. Certain aspects of the present disclosure provide for replacing the resistive elements in at least one stage with transistors operating in the triode region, where the on-resistance is controlled by a feedback network.

11 Claims, 7 Drawing Sheets

(51) Int. Cl.
*H03H 7/01* (2006.01)
*H03H 7/21* (2006.01)
*H03H 11/22* (2006.01)
*H03H 17/02* (2006.01)

(52) U.S. Cl.
CPC ......... *H03H 11/22* (2013.01); *H03H 17/0273* (2013.01); *H03H 2218/04* (2013.01)

(58) Field of Classification Search
USPC .................. 327/551–559, 355–361; 708/819
See application file for complete search history.

(56) References Cited

U.S. PATENT DOCUMENTS

| | | | |
|---|---|---|---|
| 6,831,506 B1 | 12/2004 | Moffat et al. | |
| 7,756,491 B2* | 7/2010 | Kee | H03F 1/3282 |
| | | | 455/114.3 |
| 7,978,785 B2* | 7/2011 | Leifso | H03B 19/14 |
| | | | 327/122 |
| 8,412,141 B2* | 4/2013 | Savoj | H03H 7/21 |
| | | | 333/172 |
| 8,552,782 B1 | 10/2013 | Trueheart et al. | |
| 2003/0001648 A1 | 1/2003 | Okazaki et al. | |
| 2004/0150420 A1 | 8/2004 | Fiedler | |
| 2005/0220224 A1* | 10/2005 | Dornbusch | H03H 7/21 |
| | | | 375/324 |
| 2007/0241737 A1 | 10/2007 | Yen et al. | |
| 2012/0256673 A1 | 10/2012 | Fujibayashi | |
| 2014/0086364 A1 | 3/2014 | Schell et al. | |
| 2014/0176259 A1* | 6/2014 | Reynaert | H03H 7/06 |
| | | | 333/172 |

OTHER PUBLICATIONS

Gawargy M.B., et al., "Economic Implementation of a High Performance FDM System Using the Sequence Discriminator", May 8, 1989; May 8, 1989-May 11, 1989, May 8, 1989 (May 8, 1989), pp. 1821-1826, XP010084734.

International Search Report and Written Opinion—PCT/US2015/042414—ISA/EPO—Feb. 24, 2016.

Partial International Search Report—PCT/US2015/042414—ISA/EPO—Nov. 2, 2015.

* cited by examiner

HIGH ACCURACY MILLIMETER WAVE/RADIO FREQUENCY WIDEBAND IN-PHASE AND QUADRATURE GENERATION

TECHNICAL FIELD

Certain aspects of the present disclosure generally relate to radio frequency (RF) circuits and, more particularly, to in-phase (I) and quadrature (Q) signal generation using a polyphase filter (PPF).

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1xRTT (1 times Radio Transmission Technology, or simply 1x), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, $3^{rd}$ Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

SUMMARY

Certain aspects of the present disclosure generally relate to generating in-phase and quadrature signals using a polyphase filter.

Certain aspects of the present disclosure provide a polyphase filter for generating in-phase (I) and quadrature (Q) oscillating signals. The polyphase filter generally includes a first resistor-capacitor (RC) polyphase filter stage, wherein resistors in the first stage have a first nominal resistance value, and a second RC polyphase filter stage cascaded with the first stage. A portion of resistors in the second stage have a second nominal resistance value greater than the first nominal resistance value by a first offset, and a remaining portion of the resistors in the second stage have a third nominal resistance value less than the first nominal resistance value by a second offset.

According to certain aspects, the first offset equals the second offset.

According to certain aspects, half of the resistors in the second stage have the second nominal resistance value, and the other half of the resistors in the second stage have the third nominal resistance value.

According to certain aspects, at least one of the first offset or the second offset is less than or equal to 2% of the first nominal resistance value. For certain aspects, the I and Q oscillating signals have a phase mismatch in an 8 GHz bandwidth centered around 60 GHz of less than 2.0°. For certain aspects, the I and Q oscillating signals have an amplitude mismatch in an 8 GHz bandwidth centered around 60 GHz of less than 0.015 dB.

According to certain aspects, the first stage and the second stage comprise 4-phase RC polyphase filter stages.

According to certain aspects, the first stage precedes the second stage, and the first stage is configured to receive an oscillating signal. In this case, the second stage may output the I and Q oscillating signals.

According to certain aspects, the second stage precedes the first stage and is configured to receive an oscillating signal, and the first stage outputs the I and Q oscillating signals.

Certain aspects of the present disclosure provide a circuit for generating in-phase (I) and quadrature (Q) oscillating signals. The circuit generally includes a frequency synthesizer for generating an oscillating signal and a polyphase filter configured to produce the I and Q oscillating signals from the oscillating signal. The polyphase filter generally includes a first stage and a second stage. The first stage has a resistor-capacitor (RC) polyphase filter stage topology and includes a plurality of resistors and a first plurality of capacitors. The second stage has the RC polyphase filter stage topology, is cascaded with the first stage, and includes a second plurality of capacitors, wherein resistance in the second stage is provided by a plurality of transistors.

According to certain aspects, there are no resistors in the second stage.

According to certain aspects, the transistors are operated in a triode region of the transistors.

According to certain aspects, gates of the transistors are controlled by a feedback network. For certain aspects, the feedback network generally includes a current source; a feedback transistor for sinking a reference current generated by the current source; an amplifier having a first input terminal, a second input terminal, and an output terminal; and a voltage reference configured to provide a reference voltage and connected with the first input terminal of the amplifier. The amplifier drives the feedback transistor such that a feedback voltage provided by the reference current multiplied with an on-resistance of the feedback transistor and sensed by the second input terminal of the amplifier is equal to the reference voltage at the first input terminal. The output terminal is connected with a gate of the feedback transistor. For certain aspects, the voltage reference is a bandgap voltage reference, and the current source is a bandgap current source.

According to certain aspects, the first stage comprises a 4-phase RC polyphase filter stage.

According to certain aspects, the second stage precedes the first stage.

According to certain aspects, the transistors comprise NMOS transistors. For other aspects, the transistors may include PMOS transistors.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and the like. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art. The techniques described herein may also be implemented in any of various other suitable wireless systems using radio frequency (RF) technology, including Global Navigation Satellite System (GNSS), Bluetooth, IEEE 802.15 (Wireless Personal Area Network (WPAN)), Near Field Communication (NFC), Small Cell, Frequency Modulation (FM), and the like.

An Example Wireless System

Figure 1:
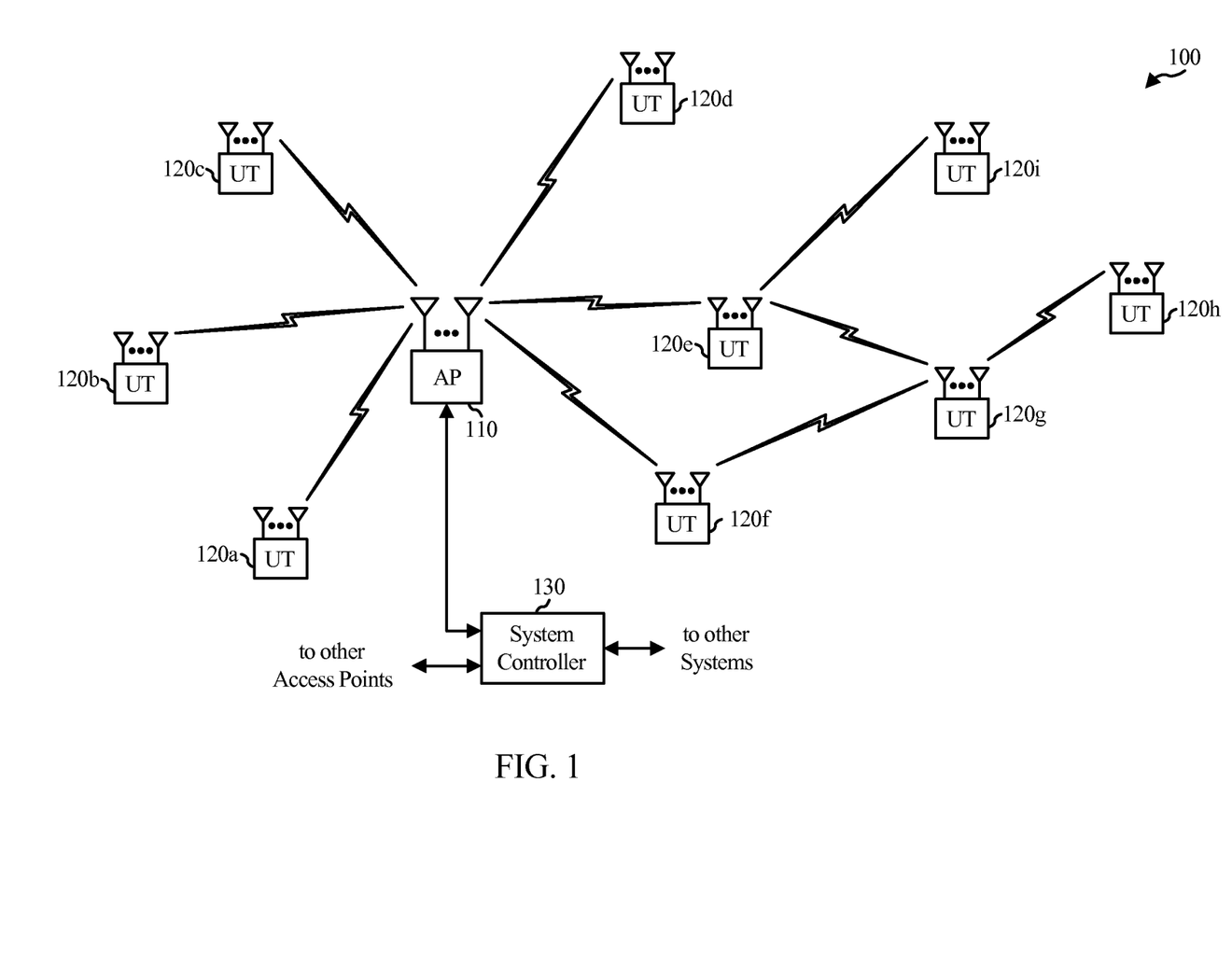
FIG. 1 is a diagram of an example wireless communications network in accordance with certain aspects of the present disclosure.

FIG. 1 illustrates a wireless communications system 100 with access points and user terminals. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal may be equipped with a single antenna (e.g., in order to keep costs down) or multiple antennas (e.g., where the additional cost can be supported).

Figure 2:
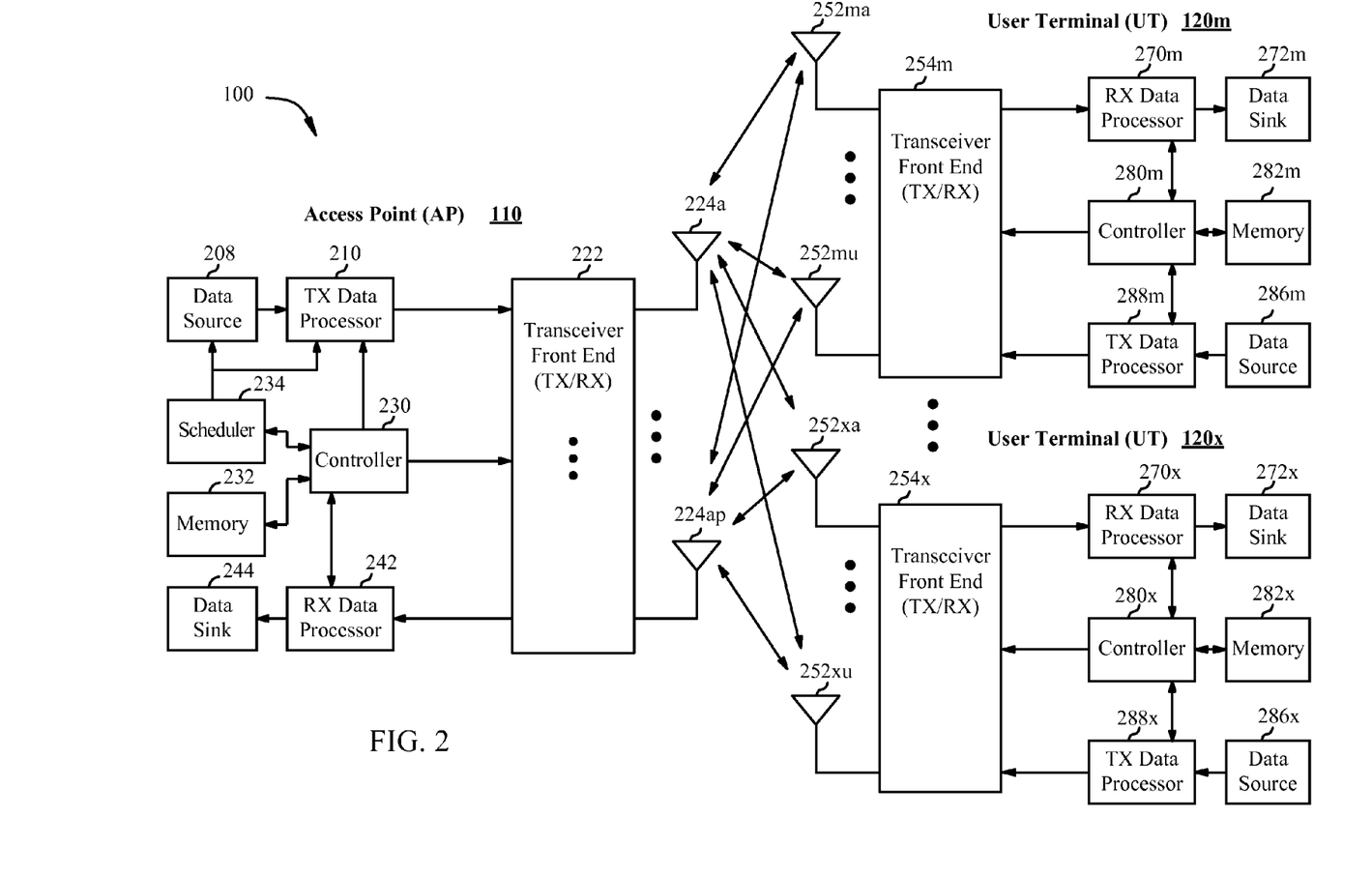
FIG. 2 is a block diagram of an example access point (AP) and example user terminals in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. For certain aspects of the present disclosure, a combination of the signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230

At each user terminal 120, $N_{ut,m}$ antennas 252 receive the downlink signals from access point 110. For receive diversity at the user terminal 120, the transceiver front end 254 may select signals received from one of the antennas 252 for processing. For certain aspects of the present disclosure, a combination of the signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
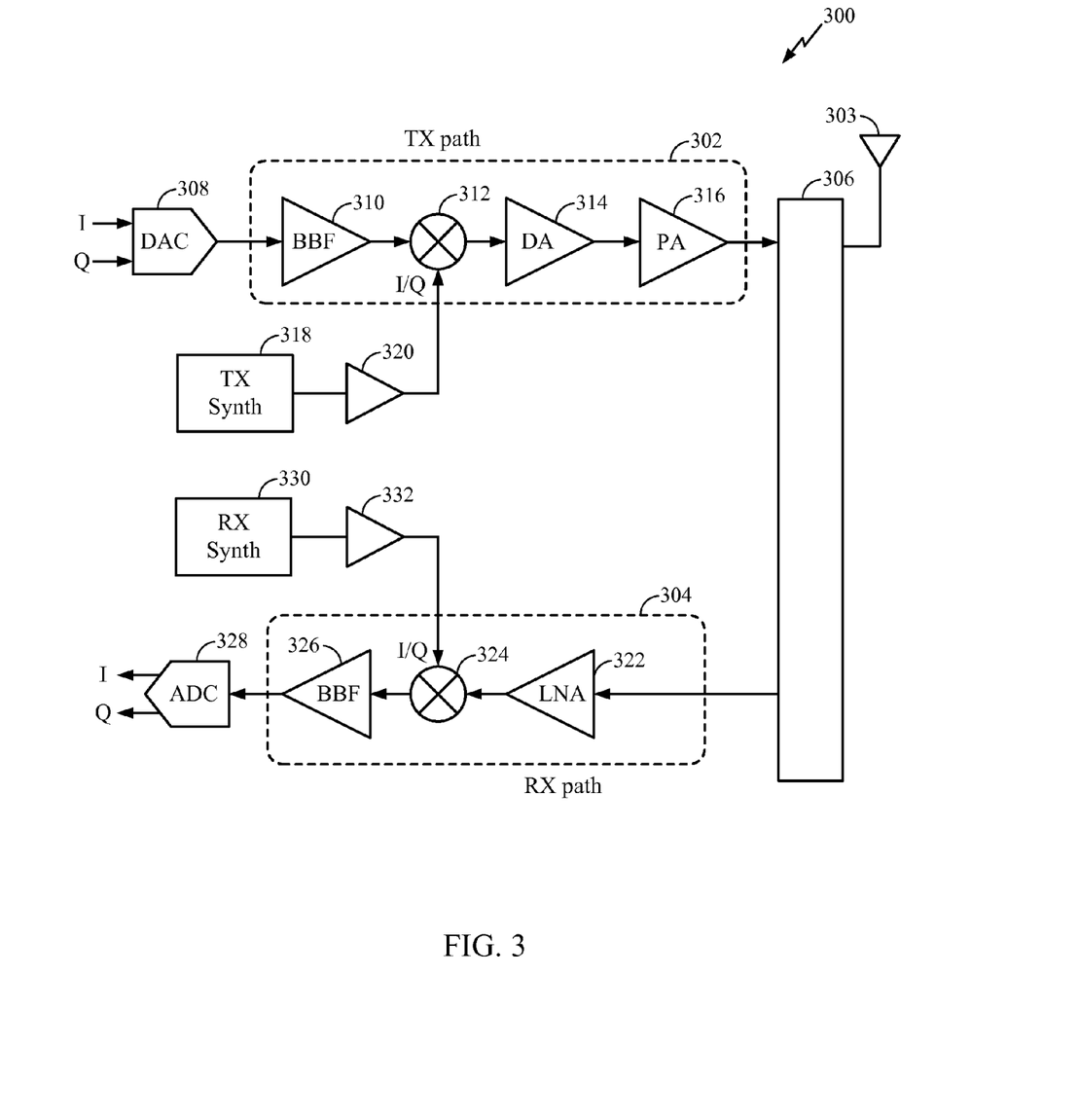
FIG. 3 is a block diagram of an example transceiver front end in accordance with certain aspects of the present disclosure.

FIG. 3 is a block diagram of an example transceiver front end 300, such as transceiver front ends 222, 254 in FIG. 2, in accordance with certain aspects of the present disclosure. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier 316. The BBF 310, the mixer 312, and the DA 314 may be included in a radio frequency integrated circuit (RFIC), while the PA 316 is often external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). Known as heterodyning, this frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems employ frequency synthesizers with a voltage-controlled oscillator (VCO) to generate a stable, tunable LO with a particular tuning range. Thus, the transmit LO is typically produced by a TX frequency synthesizer 318, which may be buffered or amplified by amplifier 320 before being mixed with the baseband signals in the mixer 312. Similarly, the receive LO is typically produced by an RX frequency synthesizer 330, which may be buffered or amplified by amplifier 332 before being mixed with the RF signals in the mixer 324.

Example Polyphase Filters

A high performance and high data rate wireless system benefits from generating an accurate I/Q local oscillator (LO) with desired noise performance (e.g., in the TX frequency synthesizer 318 or the RX frequency synthesizer 330). As used herein, an I/Q LO generally refers to a local oscillator having in-phase (I) and quadrature (Q) oscillating signals, where the Q signal has a phase shift of about 90° with respect to the I signal.

Zero intermediate frequency (IF) transceivers have numerous benefits in terms of power and area, and may operate with a LO frequency of 60 GHz, for example. However, generating an accurate I/Q LO at 60 GHz with small amplitude and phase mismatch is quite challenging. For example, a high performance 60 GHz transceiver may demand an amplitude mismatch of less than 10 percent and a phase mismatch of less than 5° over the roughly 7 or 8 GHz bandwidth (BW). In light of complementary metal oxide semiconductor (CMOS) scaling and variations due to process, voltage, and temperature (PVT), it is difficult to maintain the desired I/Q mismatch across the specified BW. I/Q mismatch may lead to (and may also be referred to as) residual sideband (RSB).

Several options are available for designing a frequency synthesizer that maintains the desired I/Q mismatch across the specified BW. As a first option, a frequency synthesizer may use an IF transceiver (as opposed to a direct-conversion transceiver), which makes I/Q LO generation easier at lower frequencies. However, this option consumes unnecessary power and area (i.e., IC real estate).

As a second option, the frequency synthesizer may operate a voltage-controlled oscillator (VCO) at 120 GHz with a divide-by-two frequency dividing circuit to generate the I/Q LO at 60 GHz. This option also consumes unnecessary power and does not achieve acceptable phase noise (PN).

As a third option, a frequency synthesizer may use a quadrature VCO (QVCO) to generate the I/Q LO. A QVCO typically has, for example, a first VCO that generates an I signal and a second VCO that generates a Q signal 90° out of phase with the I signal. A QVCO can deliver the I/Q LO with acceptable mismatch; however, it may be difficult to obtain acceptable PN and tuning range at 60 GHz.

Figure 4:
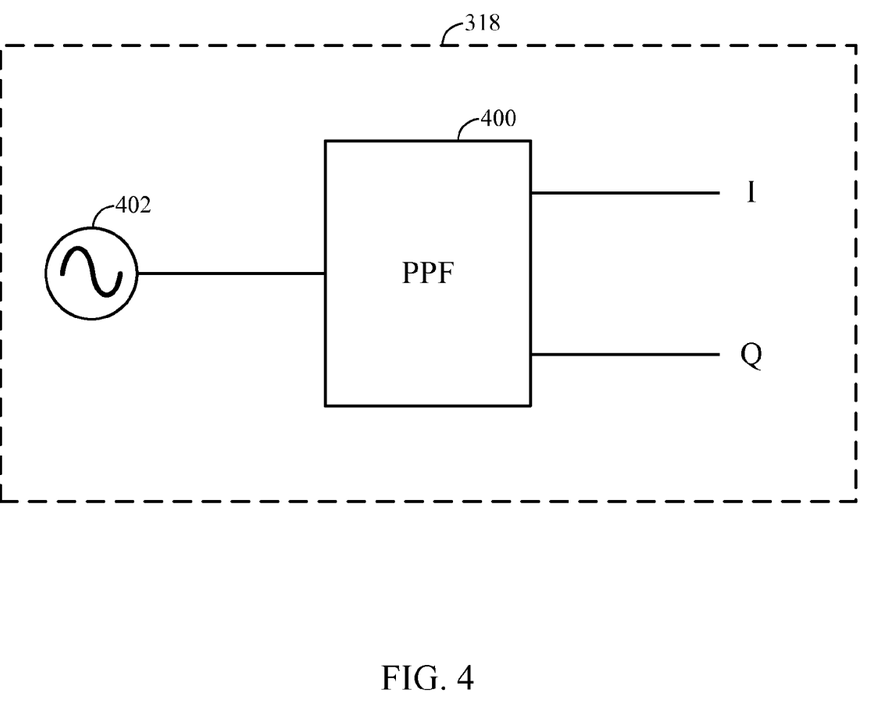
FIG. 4 is a block diagram of an example transmit (TX) frequency synthesizer having an oscillator and a polyphase filter (PPF) for generating in-phase (I) and quadrature (Q) oscillating signals, in accordance with certain aspects of the present disclosure.

As a fourth option, the frequency synthesizer may use a VCO in conjunction with a polyphase filter (PPF) for the I/Q LO generation. Thus, as illustrated in the conceptual diagram of FIG. 4, a TX frequency synthesizer 318 (or an RX frequency synthesizer 330) may comprise a VCO 402 driving a PPF 400 to output the I and Q LO signals. A polyphase filter is capable of receiving an input signal and generating equally balanced in-phase and quadrature (90° out of phase) signals at its output. A passive polyphase filter may be implemented with capacitors and resistors as illustrated in PPF 500 of FIG. 5 and may be referred to as a resistor-capacitor (RC) polyphase filter. A PPF may have one or more filter stages, each stage having a network of symmetrically configured resistors with nominal resistance value R and capacitors with nominal capacitance value C.

A conventional RC PPF can deliver I/Q LO with acceptable I/Q mismatch with, for example, three or more stages. However, the increased number of stages can adversely impact the power consumption of the frequency synthesizer, as well as increase the cost and area. On the other hand, a conventional two-stage PPF will have significant I/Q mismatch because the R and C values of the PPF change considerably with PVT variations.

Accordingly, what is needed are techniques and apparatus for generating an I/Q LO having acceptable I/Q mismatch over PVT with reduced cost, area, and power consumption.

Figure 5:
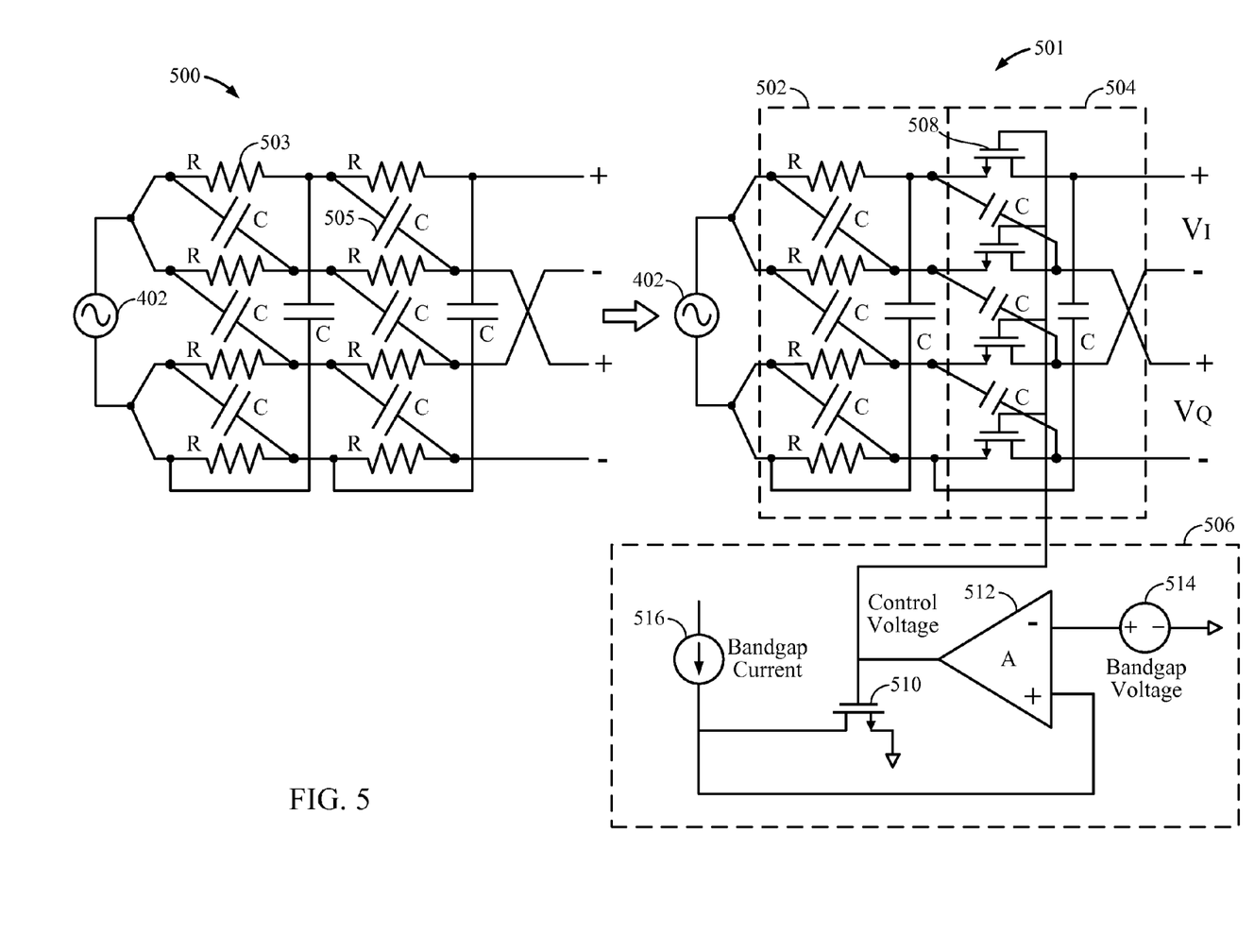
FIG. 5 is a block diagram of an example polyphase filter having resistors of one stage replaced with transistors and an example feedback network driving the gate voltages of the transistors, in accordance with certain aspects of the present disclosure.

Certain aspects of the present disclosure provide an I/Q LO generator having a PPF with variable resistance values in one or more stages. The variable resistance values may be controlled by a feedback network. For example, the second stage resistors of the PPF 500 may be replaced with transistors that are operated in the triode region, such that the adjustable channel resistances function as variable resistors. A feedback network may drive the gate voltage that controls the channel resistances of the transistors.

FIG. 5 is a conceptual diagram of a VCO 402 driving a 4-phase RC PPF 501 having a first stage 502 and a second stage 504. Each stage comprises resistive elements (e.g., resistors 503) and capacitive elements (e.g., capacitors 505) that are connected as illustrated in FIG. 5. In certain aspects of the present disclosure, the resistors 503 of one or more stages (e.g., the second stage 504 as shown in FIG. 5) of the PPF 501 may be replaced with transistors 508 (e.g., NMOS transistors as illustrated). The drain of each transistor 508 may be connected with an output node of the PPF 501 (as illustrated in FIG. 5) or to an input node of a subsequent stage. Likewise, the source of each transistor 508 may be connected with an output node of a previous stage (e.g., the first stage 502) or an input node of the PPF 501. For certain aspects, the drain and source may be swapped. A person having ordinary skill in the art will understand that other transistor types may be used, such as PMOS transistors, and that a single transistor 508 in FIG. 5 may represent multiple transistors in parallel.

Each transistor 508 may be operated in its triode region by a gate voltage that is controlled by a feedback network 506. The feedback network 506 may include an amplifier 512 having a first input terminal (e.g., a negative terminal), a second input terminal (e.g., a positive terminal), and an output terminal. The first input terminal of the amplifier 512 may be connected with a voltage reference (i.e., a bandgap voltage reference 514) that provides a reference voltage. The feedback network 506 also includes a feedback transistor 510 configured to sink a reference current generated by a current source (e.g., a bandgap current source 516). A person having ordinary skill in the art will understand that the single feedback transistor 510 in FIG. 5 may represent multiple cascaded transistors (or multiple transistors in parallel) in an effort to reduce power consumption. The bandgap current source 516 and bandgap voltage reference 514 provide fixed current and voltage references irrespective of variations in temperature, power supply voltage, and load. The feedback voltage sensed by the second input terminal of the amplifier 512 equals the reference current multiplied by the on-resistance ($R_{DS,on}$) of the feedback transistor 510. Therefore, according to operational amplifier theory, the gate voltage of the feedback transistor 510 and the transistors 508 of the PPF 501 are driven by the output terminal of the amplifier 512 such that the feedback voltage sensed by the second input terminal of the amplifier is equal to the reference voltage at the first input terminal.

Figure 6:
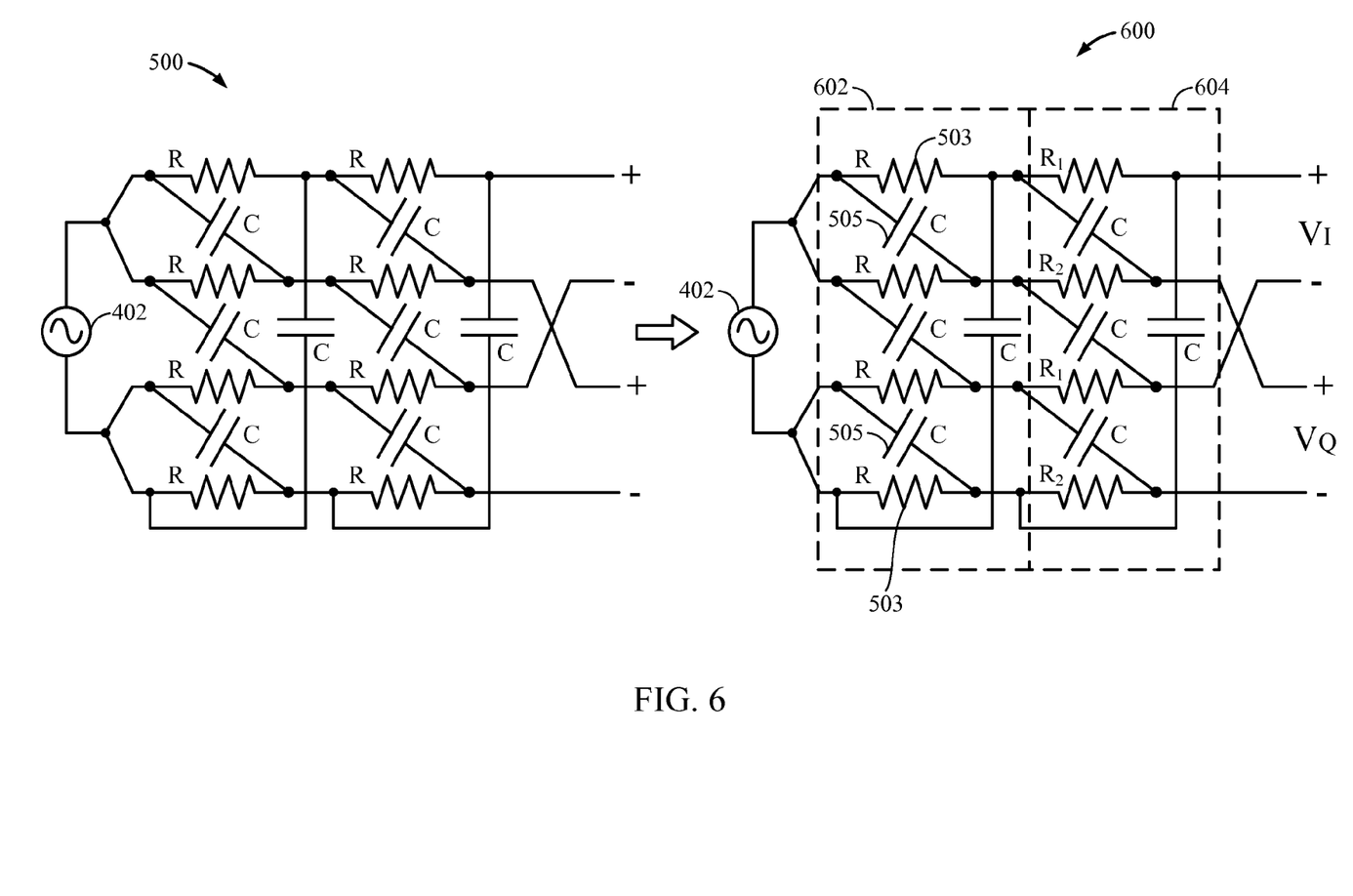
FIG. 6 is a block diagram of an example PPF having mismatched resistor values, in accordance with certain aspects of the present disclosure.

Certain aspects of the present disclosure provide an RC PPF where the resistive elements in one or more stages have intentionally mismatched resistive values R1 and R2, compared to the nominal resistance value R. For example, FIG. 6 illustrates a PPF 600 wherein the resistive elements 503 in the second stage 604 may have intentionally mismatched resistance values R1 and R2, compared to the nominal resistance value R. For other aspects, the resistive elements 503 in the first stage 602 may have intentionally offset resistance values R1 and R2, whereas the resistive elements 503 in the second stage 604 have the nominal resistance value R. By intentionally introducing resistance value mismatch as illustrated in FIG. 6, the phase mismatch of the system may be reduced without degrading the amplitude mismatch. A delta value (Δ) ranging from, for example, −0.02 to +0.02 (i.e., −2% to +2%) may be used to determine the various resistance values in accordance with the following equations:

$$R1 = R(1-\Delta)$$

$$R2 = R(1+\Delta)$$

Intentional capacitance value mismatch may also be introduced in addition to, or as an alternative to resistance value mismatch. Resistance and/or capacitance value mismatch may be applied to either the first stage, the second stage, or both stages of the polyphase filter. In addition, the polyphase filter may comprise more than two stages (e.g., to obtain lower I/Q mismatch, albeit with increased power and area consumption).

Figure 7:
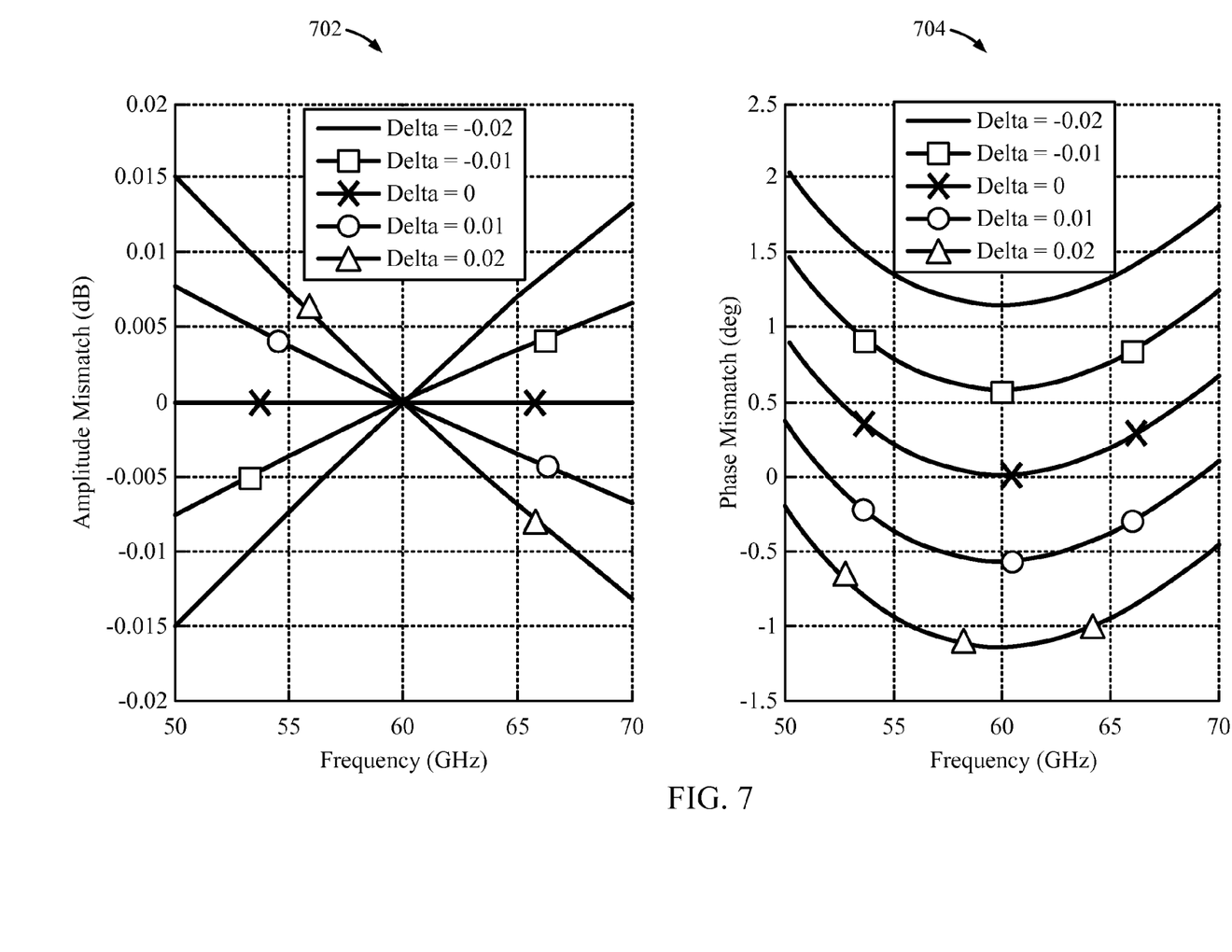
FIG. 7 includes example graphs of amplitude and phase mismatch versus frequency for different resistor mismatch values, in accordance with certain aspects of the present disclosure.

FIG. 7 includes a graph 702 of amplitude mismatch (in dB)—as well as a graph 704 of phase mismatch 704 (in degrees)—as a function of frequency (in GHz) for different Δ values for the PPF 600 of FIG. 6. The graphs 702, 704 illustrate the amplitude mismatch and phase mismatch across a bandwidth with a center frequency of 60 GHz for Δ values ranging from −0.02 to +0.02. For example, a Δ value ranging from −0.02 to +0.02 across an 8 GHz bandwidth centered around 60 GHz can provide an amplitude mismatch of less than 0.015 dB and a phase mismatch of less than 2.0°. As illustrated in the graph 704, as the Δ value increases from −0.02 to +0.02, the phase mismatch decreases. Depending on the application, a designer may desire a Δ value of 0 to have the lowest phase mismatch near 60 GHz or a Δ value of +0.01 to have the lowest phase mismatch across the entire bandwidth from 50 to 70 GHz.

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for receiving may comprise a receiver (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for processing or means for determining may comprise a processing system, which may include one or more processors, such as the RX data processor 270, the TX data processor 288, and/or the controller 280 of the user terminal 120 illustrated in FIG. 2.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A circuit for generating in-phase (I) and quadrature (Q) oscillating signals, comprising:
    a frequency synthesizer for generating an oscillating signal; and
    a polyphase filter configured to produce the I and Q oscillating signals from the oscillating signal, the polyphase filter comprising:
        a first stage having a resistor-capacitor (RC) polyphase filter stage topology and comprising a plurality of resistors and a first plurality of capacitors; and
        a second stage having the RC polyphase filter stage topology, cascaded with the first stage, and comprising a second plurality of capacitors, wherein resistance in the second stage is provided by a plurality of transistors, wherein gates of the transistors are controlled by a feedback network, the feedback network comprising a feedback transistor having a gate coupled to the gates of the plurality of transistors and configured to sink a reference current generated by a current source.

2. The circuit of claim 1, wherein there are no resistors in the second stage.

3. The circuit of claim 1, wherein the transistors are operated in a triode region of the transistors.

4. The circuit of claim 1, wherein the feedback network comprises:
    an amplifier having a first input terminal, a second input terminal, and an output terminal, wherein the output terminal is connected with a gate of the feedback transistor; and
    a voltage reference configured to provide a reference voltage and connected with the first input terminal of the amplifier, wherein the amplifier drives the feedback transistor such that a feedback voltage provided by the reference current multiplied with an on-resistance of the feedback transistor and sensed by the second input terminal of the amplifier is equal to the reference voltage at the first input terminal.

5. The circuit of claim 4, wherein the voltage reference is a bandgap voltage reference and wherein the current source is a bandgap current source.

6. The circuit of claim 1, wherein the first stage comprises a 4-phase RC polyphase filter stage.

7. The circuit of claim 1, wherein the second stage precedes the first stage.

8. The circuit of claim 1, wherein the transistors comprise NMOS transistors.

9. The circuit of claim 1, wherein the transistors comprise PMOS transistors.

10. The circuit of claim 1, wherein the resistance in the second stage is programmable.

11. The circuit of claim 1, wherein the capacitance of the capacitors in the second stage is programmable.

* * * * *